(12) United States Patent
Lee (10) Patent No.: US 10,374,011 B2
(45) Date of Patent: Aug. 6, 2019

(54) RESISTANCE CHANGE MEMORY DEVICES (71) Applicant: SK hynix Inc., Icheon-si (KR)

(72) Inventor: Sanghun Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/986,932

(22) Filed: May 23, 2018

(65) Prior Publication Data

US 2018/0358410 A1 Dec. 13, 2018

(30) Foreign Application Priority Data

Jun. 8, 2017 (KR) .................. 10-2017-0071602

(51) Int. Cl.
*G11C 11/22* (2006.01)
*G11C 13/00* (2006.01)
*H01L 27/24* (2006.01)
*H01L 45/00* (2006.01)

(52) U.S. Cl.
CPC .......... *H01L 27/2463* (2013.01); *G11C 11/22* (2013.01); *G11C 13/0007* (2013.01); *G11C 13/0069* (2013.01); *H01L 45/06* (2013.01); *H01L 45/08* (2013.01); *H01L 45/085* (2013.01); *H01L 45/1233* (2013.01); *H01L 45/1253* (2013.01); *H01L 45/142* (2013.01); *H01L 45/143* (2013.01); *H01L 45/144* (2013.01); *H01L 45/146* (2013.01); *H01L 45/147* (2013.01)

(58) Field of Classification Search
CPC .... H01L 27/2463; H01L 45/08; H01L 45/147
See application file for complete search history.

(56) References Cited

U.S. PATENT DOCUMENTS

| 8,687,401 | B2 | 4/2014 | Jiang et al. |
| 9,053,801 | B2 * | 6/2015 | Sandhu .................. G11C 11/22 |
| 2010/0135061 | A1 * | 6/2010 | Li .......................... G11C 11/22 365/145 |
| 2018/0286988 | A1 * | 10/2018 | Yoo .................. H01L 29/78391 |

FOREIGN PATENT DOCUMENTS

KR 10-2013-0111754 A 10/2013

OTHER PUBLICATIONS

"TiOx-Based RRAM Synapse With 64-Levels of Conductance and Symmetric Conductance Change by Adopting a Hybrid Pulse Scheme for Neuromorphic Computing", Park et al, IEEE Electron Device Letters, vol. 37 No. 12, pp. 1559-1562.

* cited by examiner

Primary Examiner — Allison Bernstein (57) ABSTRACT

A resistance change memory device includes a lower electrode, a ferroelectric material layer disposed on the lower electrode, a resistance switching material layer disposed on the ferroelectric material layer, and an upper electrode disposed on the resistance switching material layer.

20 Claims, 9 Drawing Sheets

FIG. 9

RESISTANCE CHANGE MEMORY DEVICES

CROSS-REFERENCE TO RELATED APPLICATIONS

The present application claims priority under 35 U.S.C 119(a) to Korean Application No. 10-2017-0071602, filed on Jun. 8, 2017, which is herein incorporated by references in its entirety.

BACKGROUND

1. Technical Field

The present disclosure generally relates to semiconductor devices, and more particularly, to resistance change memory devices including a ferroelectric material layer.

2. Related Art

Generally, each of resistive memory devices may include a plurality of resistive memory cells, and each resistive memory cell may include a variable resistive material whose electrical resistance value varies according to a voltage or a current that is applied to the variable resistive material. Information corresponding to the varied resistance value of the variable resistive material may be regarded as a datum stored in the resistive memory cell. In such a case, the resistive memory cells may retain their stored data even if their power supplies are interrupted. Thus, the resistive memory devices may correspond to nonvolatile memory devices, and the resistive memory cells including the variable resistive material may act as multi-level cells. The resistive memory devices may include resistance change random access memory (RCRAM) devices (also, referred to as resistance change memory devices), phase change random access memory (PCRAM) devices and magnetic random access memory (MRAM) devices.

Recently, a lot of effort has been focused on developing the RCRAM devices, including multi-level cells, each of which is capable of storing at least two-bit data (i.e., multi-bit data), to increase the integration density of the RCRAM devices. The multi-level cell of the RCRAM devices may be programmed by applying any one among a plurality of program voltage levels to the variable resistive material of the multi-level cell.

SUMMARY

According to an embodiment, there is provided a resistance change memory device. The resistance change memory device includes a lower electrode, a ferroelectric material layer disposed on the lower electrode, a resistance switching material layer disposed on the ferroelectric material layer, and an upper electrode disposed on the resistance switching material layer.

According to another embodiment, there is provided a resistance change memory device. The resistance change memory device includes a lower electrode, a ferroelectric material layer disposed on the lower electrode having remanent polarization, a resistance switching material layer disposed on the ferroelectric material layer including movable oxygen ions, and an upper electrode disposed on the resistance switching material layer. A resistance value of the resistance change memory device is determined according to formation or decomposition of an interfacial insulation layer, located between the upper electrode and the resistance switching material layer, when an external voltage is applied to the upper electrode while the lower electrode is grounded.

DETAILED DESCRIPTION OF THE EMBODIMENTS

Various embodiments of the present disclosure will now be described more fully hereinafter with reference to the accompanying drawings. In the drawing figures, the dimensions (e.g., widths or thicknesses) of components (e.g., layers or regions) may be exaggerated for clarity of illustration. It will be understood that when an element is referred to as being "on" another element, it can be directly "on" the other element or intervening elements may also be present. In the drawings, like reference numerals refer to like elements throughout.

As used herein, the singular terms "a," "an" and "the" are intended to include the plural forms as well, unless the context clearly indicates otherwise. It will be understood that the terms "comprise," "comprising," "includes," "including," "have", "having" and variants thereof specify the presence of stated features, integers, steps, operations, elements, and/or components, but do not preclude the presence and/or addition of one or more other features, integers, steps, operations, elements, components, and/or groups thereof.

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

Figure 1:
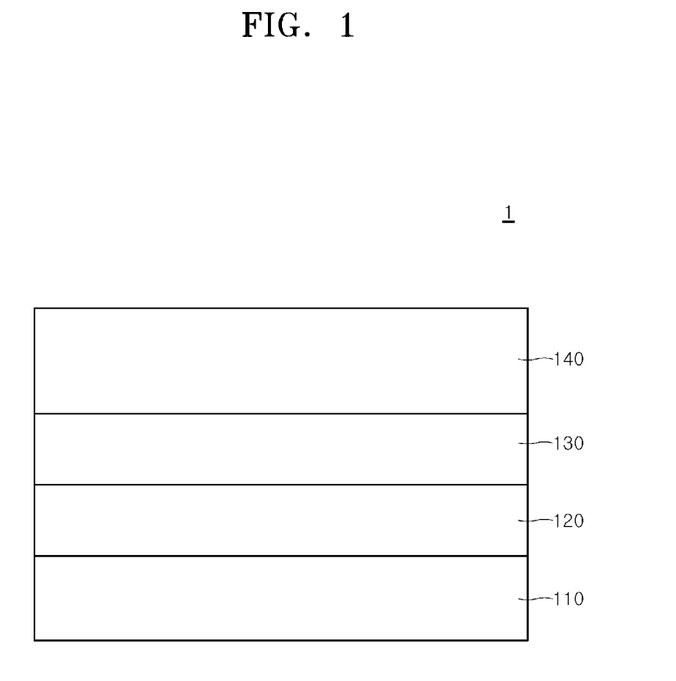
FIG. 1 is a cross-sectional view illustrating a resistance change memory device according to an embodiment of the present disclosure.

FIG. 1 is a cross-sectional view illustrating a resistance change memory device 1 according to an embodiment of the present disclosure. Referring to FIG. 1, the resistance change memory device 1 may include a lower electrode 110, a ferroelectric material layer 120, a resistance switching material layer 130 and an upper electrode 140. The ferroelectric material layer 120 and the resistance switching material layer 130 may be in contact with each other to provide an interface therebetween.

The lower electrode 110 may include a conductive material. For example, the lower electrode 110 may include a metal material, a metal nitride material, a metal oxide material, a metal silicide material or a doped semiconductor material. In an embodiment, the lower electrode 110 may include a tungsten (W) material, an aluminum (Al) material, a copper (Cu) material, a tantalum (Ta) material, a titanium (Ti) material, a gold (Au) material, a platinum (Pt) material, a silver (Ag) material, a ruthenium (Ru) material, an iridium (Ir) material, a molybdenum (Mo) material, a tungsten nitride (WN) material, an aluminum nitride (AlN) material, a titanium nitride (TiN) material, a tantalum nitride (TaN) material, a molybdenum nitride (MoN) material, a niobium nitride (NbN) material, a titanium silicon nitride (TiSiN) material, a titanium aluminum nitride (TiAlN) material, a titanium boron nitride (TiBN) material, a zirconium silicon nitride (ZrSiN) material, a tungsten silicon nitride (WSiN) material, a tungsten boron nitride (WBN) material, a zirconium aluminum nitride (ZrAlN) material, a molybdenum silicon nitride (MoSiN) material, a molybdenum aluminum nitride (MoAlN) material, a tantalum silicon nitride (TaSiN) material, a tantalum aluminum nitride (TaAlN) material, a ruthenium nitride (RuN) material, a doped silicon material, or a combination containing at least two materials listed above.

Figure 5:
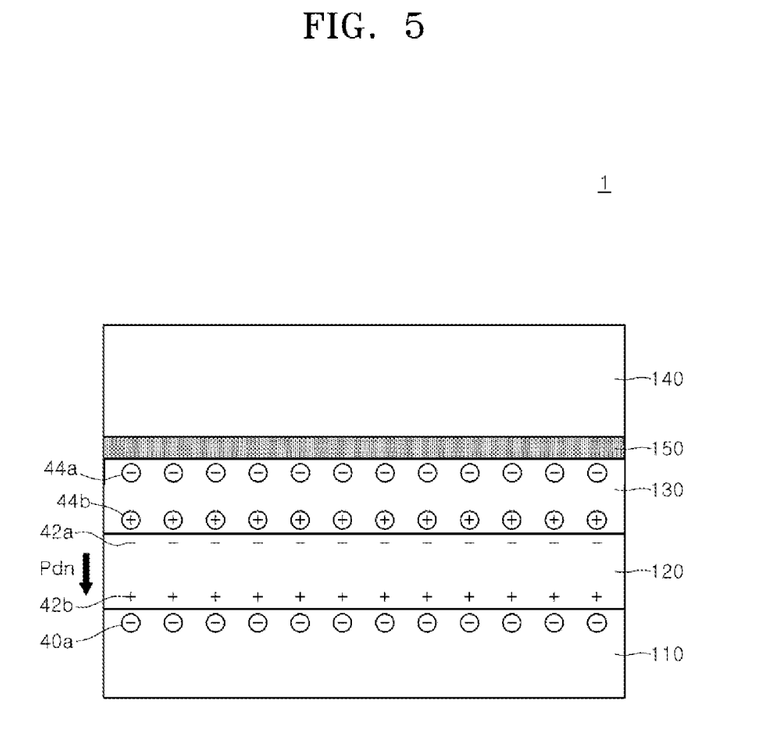
Figure 7:
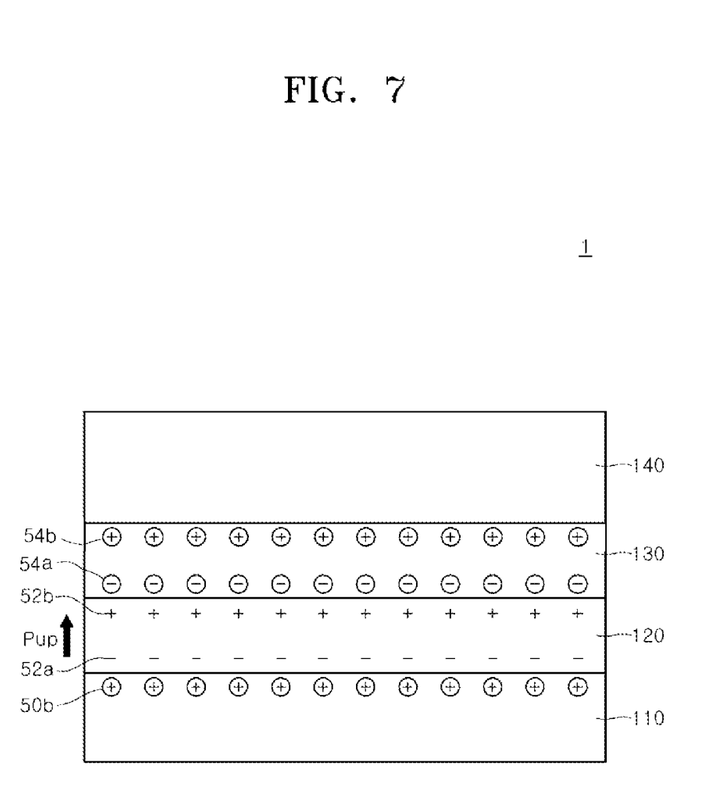

The ferroelectric material layer 120 may be disposed on a surface of the lower electrode 110. If an external voltage is applied to the ferroelectric material layer 120 to form an electric field across the ferroelectric material layer 120, a polarization direction of the ferroelectric material layer 120 may be switched. After the external voltage applied to the ferroelectric material layer 120 is removed, a remanent polarization aligned to the electric field generated by the applied voltage may be retained in the ferroelectric material layer 120. In an embodiment, the remanent polarization of the ferroelectric material layer 120 may be arrayed to be parallel to a line (not shown) perpendicular to a surface and vertically penetrating a thickness of the ferroelectric material layer 120. For example, the ferroelectric material layer 120 may have a remanent polarization Pdn which is arrayed or oriented from the resistance switching material layer 130 toward the lower electrode 110, as illustrated in FIG. 5. Alternatively, the ferroelectric material layer 120 may have a remanent polarization Pup which is arrayed or oriented from the lower electrode 110 toward the resistance switching material layer 130, as illustrated in FIG. 7.

In an embodiment, the ferroelectric material layer 120 may include a metal oxide material having a perovskite crystalline structure. The ferroelectric material layer 120 may include, for example, a lead zirconium titanium oxide ($Pb[Zr_xTi_{1-x}]O_3$, where, $0<x<1$) material, a barium titanium oxide ($BaTiO_3$) material, a strontium bismuth tantalum oxide ($SrBi_2Ta_2O_9$) material, a strontium bismuth tantalum niobium oxide ($SrBi_2[Ta_{1-x}Nb_x]_2O_9$, where, $0<x<1$) material, a bismuth lanthanum titanium oxide ($[Bi, La]_4Ti_3O_{12}$) material, or the like.

In another embodiment, the ferroelectric material layer 120 may include a metal oxide material such as a hafnium oxide material, a zirconium oxide material, a hafnium zirconium oxide material, or a combination containing at least two different materials thereof. In such a case, the ferroelectric material layer 120 may be doped with dopants. The dopants injected into the ferroelectric layer 120 may include carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), lanthanum (La), or a combination containing at least two different elements thereof.

Referring again to FIG. 1, the resistance switching material layer 130 may be disposed on a surface of the ferroelectric material layer 120 opposite to a surface interfacing with the lower electrode 110. That is, the resistance switching material layer 130 may be disposed directly on the ferroelectric material layer 120. In some embodiments, if an external voltage is applied to the resistance switching material layer 130, oxygen atoms are generated and migrate or move towards an interface between the upper electrode 140 and the resistance switching material layer 130. The collected oxygen atoms may react with the upper electrode 140 to form an insulation layer. The resistance switching material layer 130 may include labile, movable oxygen ions. For example, the resistance switching material layer 130 may be a solid electrolyte material including movable oxygen ions. That is, the resistance switching material layer 130 may be an oxygen reservoir layer including movable oxygen ions.

The resistance switching material layer 130 may have a known or predictable electrical conductivity. For example, the electrical conduction of the resistance switching material layer 130 may be executed by electric charges that move through defect sites such as vacancies distributed in a solid electrolyte material employed as the resistance switching material layer 130. In an embodiment, the resistance switching material layer 130 may include a perovskite type material such as a PCMO($Pr_{1-x}Ca_xMnO_3$, where, $0<x<1$) material, a LCMO($La_{1-x}Ca_xMnO_3$, where, $0<x<1$) material, a BSCFO($Ba_{0.5}Sr_{0.5}Co_{0.8}Fe_{0.2}O_{3-\delta}$) material, a YBCO ($YBa_2Cu_3O_{7-x}$, where, $0<x<1$) material, a $(Ba,Sr)TiO_3$(Cr, Nb-doped) material, a $SrZrO3$(Cr,V-doped) material, a (La, Sr)$MnO_3$ material, a $Sr_{1-x}La_xTiO_3$(where, $0<x<1$) material, a $La_{1-x}Sr_xFeO_3$(where, $0<x<1$) material, a $La_{1-x}Sr_xCoO_3$ (where, $0<x<1$) material, a $SrFeO_{2.7}$ material, a $LaCoO_3$ material, a $RuSr_2GdCu_2O_3$ material, a $YBa_2Cu_3O_7$ material, or a combination material containing at least two different materials listed above.

In an embodiment, the resistance switching material layer 130 may include a metal oxide material having a nonstoichiometric composition. For example, the metal oxide material used as the resistance switching material layer 130 may have oxygen vacancies. The metal oxide material used as the resistance switching material layer 130 may include, for example, a titanium oxide material, an aluminum oxide material, a nickel oxide material, a copper oxide material, a zirconium oxide material, a manganese oxide material, a hafnium oxide material, a tungsten oxide material, a tantalum oxide material, a niobium oxide material, a ferrum oxide material, or a combination material containing at least two different materials listed herein.

The upper electrode 140 may be disposed on a surface of the resistance switching material layer 130 opposite to a surface interfacing with the ferroelectric material layer 120. The upper electrode 140 may include a conductive material. The upper electrode 140 may include a material in which an oxidation reaction and a reduction reaction are able to reversibly occur, particularly at the interface with a resistance switching material layer 130. If an external voltage having a first polarity (e.g., a positive voltage when the lower electrode 110 is grounded) is applied to the upper electrode 140, the upper electrode 140 may react with oxygen ions in the resistance switching material layer 130 to form an interfacial insulation layer located between the resistance switching material layer 130 and the upper electrode 140. Alternatively, if an external voltage having a second polarity (e.g., a negative voltage when the lower electrode 110 is grounded), opposite to the first polarity, is applied to the upper electrode 140, then the oxygen ions in the interfacial insulation layer may be released and the interfacial insulation layer decomposes.

The upper electrode 140 may include, for example, an aluminum (Al) material, a molybdenum (Mo) material, a platinum (Pt) material, a titanium (Ti) material, a nickel (Ni) material, a tungsten (W) material, a tantalum (Ta) material, a titanium nitride (TiN) material, a tungsten silicide ($WSi_2$) material, or a combination material containing at least two different materials thereof.

Although FIG. 1 illustrates an example in which the ferroelectric material layer 120, the resistance switching material layer 130 and the upper electrode 140 are sequentially stacked on the lower electrode 110, the present disclosure is not limited thereto. For example, in some other embodiments, the resistance switching material layer 130, the ferroelectric material layer 120 and the upper electrode 140 may be sequentially stacked on the lower electrode 110. In such a case, the lower electrode 110 may include a material in which an oxidation reaction and a reduction reaction are able to reversibly occur. That is, the lower electrode 110 may be oxidized to form an interfacial insulation layer located between the resistance switching material layer 130 and the lower electrode 110. Alternatively, the oxidized lower electrode 110 may be reduced and the interfacial insulation layer decomposed. The formation or degradation of the interfacial insulation layer is determined according to the polarity of an external voltage applied to the resistive change memory device 1 and lower electrode 110.

Referring again to FIG. 1, according to an embodiment, an electrical resistance value of the resistance change memory device 1 may be controlled by forming or generating an interfacial insulation layer between the resistance switching material layer 130, and the upper electrode 140, or by decomposing or degrading the interfacial insulation layer, according to an external voltage applied between the lower electrode 110 and the upper electrode 140. For example, if a positive voltage is applied to the upper electrode 140 when the lower electrode 110 is grounded, oxygen ions in the resistance switching material layer 130 may migrate toward the upper electrode 140 to oxidize the upper electrode 140 at the interface. As a result, an interfacial insulation layer may be formed at the interface between the resistance switching material layer 130 and the upper electrode 140. The interfacial insulation layer between the resistance switching material layer 130 and the upper electrode 140 may inhibit or reduce current flow from the upper electrode 140 to the lower electrode 110.

In an embodiment, if a positive voltage applied to the upper electrode 140 increases to a higher, predetermined threshold voltage, oxygen ions move toward the upper electrode layer 140 and the interfacial insulation layer may be formed between the resistance switching material layer 130 and the upper electrode 140, such that a resistive state of the resistance change memory device 1 is changed from a low resistive state into a high resistive state. Furthermore, if the voltage applied to the upper electrode 140 is removed after the interfacial insulation layer is formed, the interfacial insulation layer between the resistance switching material layer 130 and the upper electrode 140 may be retained. Thus, the resistance change memory device 1 may maintain a high resistive state.

Meanwhile, if a negative voltage is applied to the upper electrode 140 when the lower electrode 110 is grounded, oxygen ions may be released from the interfacial insulation layer and may drift back into the resistance switching material layer 130 and toward ferroelectric layer 120. As a result, at least a portion of the interfacial insulation layer may decompose and electrical conductivity between the upper electrode 140 and the lower electrode 110 may increase.

If a negative voltage applied to the upper electrode 140 negatively increases to a higher, predetermined threshold voltage, an electrical conductivity between the upper electrode 140 and the lower electrode 110 may increase so that a resistive state of the resistance change memory device 1 is changed from a high resistive state into a low resistive state. More specifically, if an absolute value of a negative voltage applied to the upper electrode 140 increases to a higher, predetermined threshold voltage, free electrons may migrate or drift from the upper electrode 140 into the resistance switching material layer 130, and the free electrons reaching the resistance switching material layer 130 may penetrate the ferroelectric material layer 120 by a tunneling mechanism to finally reach the lower electrode 110.

Even after the negative voltage applied to the upper electrode 140 is removed, the interfacial insulation layer may not remain between the resistance switching material layer 130 and the upper electrode 140. Thus, the resistance change memory device 1 may maintain a low resistive state in response to a sufficiently high negative threshold voltage.

Meanwhile, in an embodiment, remanent polarization formed in ferroelectric material layer 120 may stabilize a resistive state of the resistance change memory device 1 after the voltage (whether a positive polarity or a negative polarity) applied to the upper electrode 140 is removed. Specifically, the remanent polarization formed in ferroelectric material layer 120 may induce electric charges in the ferroelectric material layer to move toward the interface with the resistance switching material layer 130. The induced electric charges may create an attractive force or a repulsive force applied to the resistance switching material layer 130. The movement of electric charges (i.e., oxygen ions) in the resistance switching material layer 130 may be affected or assisted by the attractive force or the repulsive force.

As will be described with reference to FIGS. 4 and 5 later, if the resistance change memory device 1 maintains a high resistive state with an interfacial insulation layer after a voltage applied to the upper electrode 140 is removed, the remanent polarization formed in the ferroelectric material layer 120 may have an orientation that suppresses or inhibits oxygen ions released from the interfacial insulation layer. Alternatively, if the resistance change memory device 1 maintains a low resistive state after a voltage applied to the upper electrode 140 is removed, the interfacial insulation layer decomposes, and the remanent polarization formed in the ferroelectric material layer 120 may have a direction or orientation that reduces the amount of, or inhibits, oxygen ions in the resistance switching material layer 130 that move toward the upper electrode 140.

As described above, according to an embodiment, a polarization direction of the ferroelectric material layer 120 and an electrical resistance value of the resistance switching material layer 130 may be determined by applying an external voltage equal to or higher than a predetermined threshold voltage to the upper electrode 140. After the external voltage applied to the upper electrode 140 is removed, the remanent polarization formed in the ferroelectric material layer 120 may stabilize a resistive state of the resistance switching material layer 130. Thus, a data retention characteristic of the resistance change memory device 1 corresponding to a nonvolatile memory device may be improved and reliability increased.

Figure 2:
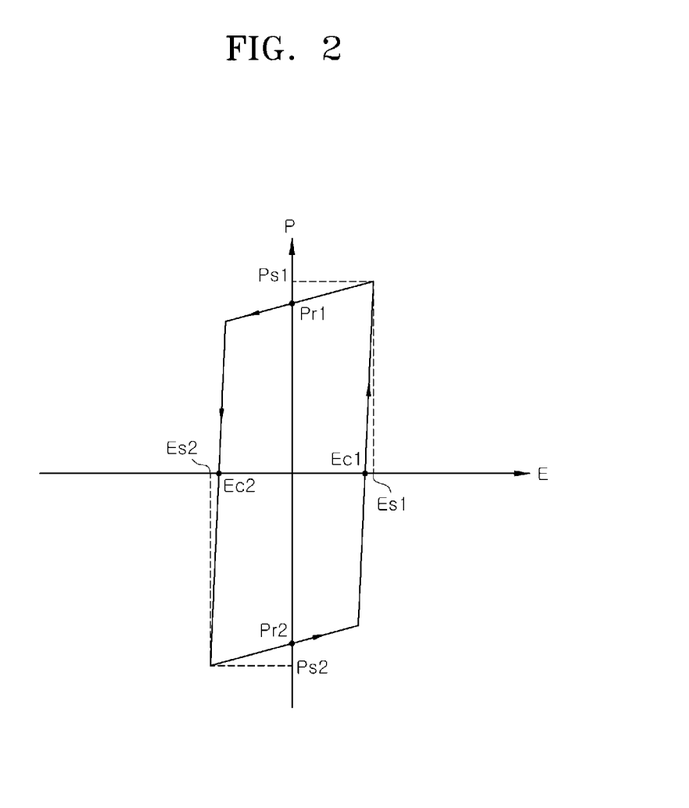
FIG. 2 is a graph illustrating a hysteresis loop of a ferroelectric material layer employed in a resistance change memory device according to an embodiment of the present disclosure.
Figure 3:
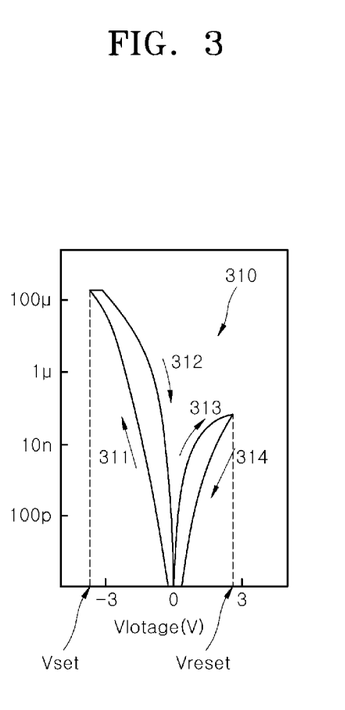
FIG. 3 is a graph of a current-voltage (I-V) curve illustrating characteristics of a resistance switching material layer employed in a resistance change memory device according to an embodiment of the present disclosure.

FIG. 2 is a graph illustrating a hysteresis loop of a ferroelectric material layer employed in a resistance change memory device according to an embodiment of the present disclosure. FIG. 3 is a graph of current-voltage (I-V) curves illustrating I-V characteristics of a resistance switching material layer employed in a resistance change memory device according to an embodiment of the present disclosure. In FIG. 2, the abscissa denotes electric field E, and the ordinate denotes polarization P. In FIG. 3, the abscissa denotes voltage V, and the ordinate denotes current. The ferroelectric material layer and the resistance switching material layer with the characteristics described in the hysteresis loop and the I-V curves illustrated in FIGS. 2 and 3 may be employed as the ferroelectric material layer 120 and the resistance switching material layer 130 of the resistance change memory device 1 described above and with reference to FIG. 1.

Referring to FIG. 2, if the electric field E formed across the ferroelectric material layer increases positively to generate at least a first coercive field Ec1, a polarization direction of the ferroelectric material layer may be switched. If the electric field E is reduced to zero after the electric field E reaches at least a first saturation field Es1, which is stronger than the first coercive field Ec1, then the ferroelectric material layer may retain a first remanent polarization Pr1. Alternatively, if the electric field E formed across the ferroelectric material layer increases in a negative direction to form at least a second coercive field Ec2, a polarization direction of the ferroelectric material layer may be switched again. If the electric field E is reduced to zero after the electric field E reaches at least a second saturation field Es2, which is stronger than the second coercive field Ec2, then the ferroelectric material layer may retain a second remanent polarization Pr2.

A first saturation polarization Ps1 corresponding to the first saturation field Es1, and a second saturation polarization Ps2 corresponding to the second saturation field Es2, are also illustrated in FIG. 2. If an absolute value of the electric field E increases in either direction to reach at least the first or second saturation field Es1 or Es2, and the electric field E is removed, then the remanent polarization Pr1 or Pr2 in the ferroelectric material layer may have corresponding directions or orientations.

Referring to FIG. 3, in an embodiment, a curve 310 may be an I-V characteristic of a resistance change memory device that employs a platinum (Pt) electrode as the lower electrode, a titanium nitride (TiN) electrode as the upper electrode, and a PCMO layer as the resistance switching material layer. Specifically, the curve 310 may be a graph reflecting a current flowing through the PCMO layer relative to the voltage V applied to the titanium nitride (TiN) electrode.

Referring to the curve 310, the voltage V having a negative polarity may be firstly applied to the PCMO layer having a high resistive state as an initial state through the titanium nitride (TiN) electrode while the platinum (Pt) electrode corresponding to the lower electrode is grounded. If the voltage V applied to the titanium nitride (TiN) electrode increases negatively from a ground voltage, the current flowing through the PCMO layer may increase along a first portion 311 of the curve 310. If the voltage V reaches a set voltage Vset, the PCMO layer may be switched from the high resistive state into a low resistive state. Thereafter, if the voltage V is reduced to the ground voltage, the current flowing through the PCMO layer may be reduced along a second portion 312 of the curve 310.

Next, the voltage V having a positive polarity may be applied to the PCMO layer having the low resistive state through the titanium nitride (TiN) electrode while the platinum (Pt) electrode corresponding to the lower electrode is grounded. If the voltage V applied to the titanium nitride (TiN) electrode increases positively from a ground voltage, the current flowing through the PCMO layer may increase along a third portion 313 of the curve 310. If the voltage V reaches a reset voltage Vreset, the PCMO layer may be switched from the low resistive state into the high resistive state. Thereafter, if the voltage V is reduced to the ground voltage, the current flowing through the PCMO layer may be reduced along a fourth portion 314 of the curve 310.

As described with reference to FIG. 3, the PCMO layer used as the resistance switching material layer may have any one of two different resistive states according to a polarity and a magnitude of the voltage V applied to a titanium nitride (TiN) electrode used as the upper electrode.

FIGS. 4 to 7 are cross-sectional views illustrating an operation of a resistance change memory device according to an embodiment of the present disclosure. The resistance change memory device described with reference to FIGS. 4 to 7 has the same configuration as the resistance change memory device 1 described above and with reference to FIG. 1. In addition, a ferroelectric material layer of the resistance change memory device described with reference to FIGS. 4 to 7 may have substantially the same hysteresis loop as illustrated in FIG. 2, and a resistance switching material layer of the resistance change memory device described with reference to FIGS. 4 to 7 may have substantially the same I-V characteristics as illustrated in FIG. 3.

Figure 4:
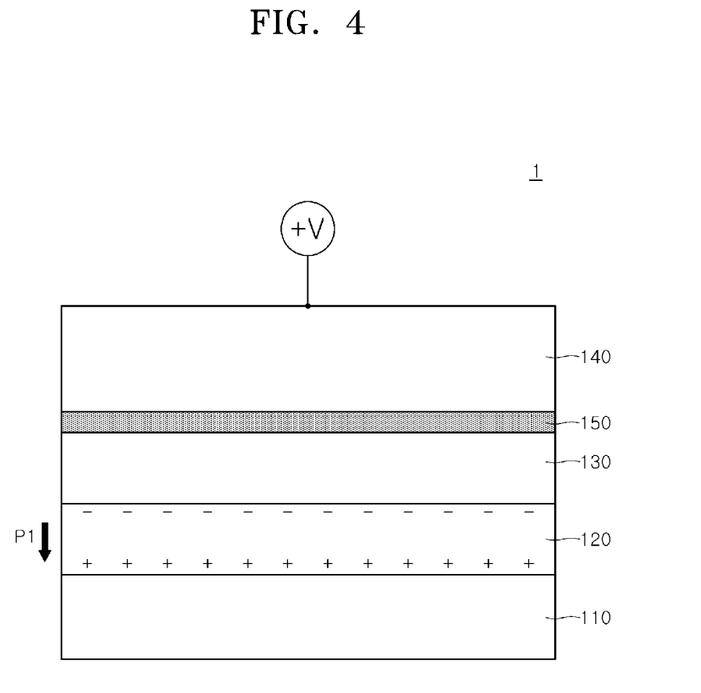
FIGS. 4 to 7 are cross-sectional views illustrating an operation of a resistance change memory device according to an embodiment of the present disclosure.

Referring to FIG. 4, a positive voltage +V may be applied to the upper electrode 140. In such a case, the lower electrode 110 may be grounded, or a predetermined negative voltage may be applied to the lower electrode 110. As an initial state, the ferroelectric layer 120 may have any one of the first remanent polarization Pr1 and the second remanent polarization Pr2 of the hysteresis loop in FIG. 2. As an initial state, the resistance switching material layer 130 may have any one of the high resistive state and the low resistive state of the I-V characteristics in FIG. 3.

The positive voltage +V may correspond to a voltage for creating or forming at least the first coercive field Ec1 (see FIG. 2) across the ferroelectric material layer 120 and for providing at least the reset voltage Vreset (see FIG. 3) applied to the resistance switching material layer 130. In an embodiment, the positive voltage +V may correspond to a voltage for creating at least the first saturation field Es1 (see FIG. 2) across the ferroelectric material layer 120 and for providing at least the reset voltage Vreset (see FIG. 3) applied to the resistance switching material layer 130.

If the positive voltage +V is applied to the upper electrode 140 while the lower electrode 110 is grounded, a first polarization P1 may be formed in the ferroelectric material layer 120 with a direction or orientation from the resistance switching material layer 130 toward the lower electrode 110. In addition, oxygen ions in the resistance switching material layer 130 may drift toward the upper electrode 140 in response to the positive voltage +V and first polarization P1 to form an interfacial insulation layer 150 at an interface between the resistance switching material layer 130 and the upper electrode 140. In such a case, the resistance change memory device 1 may have a high resistive state due to the presence of the interfacial insulation layer 150.

Referring to FIG. 5, the positive voltage (+V of FIG. 4) may be removed. The interfacial insulation layer 150 may remain in place even after the positive voltage (+V of FIG. 4) is removed. Thus, the resistance change memory device 1 may still have a high resistive state. In addition, the remanent polarization Pdn having the same direction as the first polarization P1 may be stored or retained in the ferroelectric material layer 120 after the positive voltage (+V of FIG. 4) is removed. Thus, negative charges 42a may accumulate in an upper portion of the ferroelectric material layer 120 adjacent to the resistance switching material layer 130, and positive charges 42b may accumulate in a lower portion of the ferroelectric material layer 120 adjacent to the lower electrode 110.

The remanent polarization Pdn may apply an attractive force or a repulsive force to materials having electric charges (e.g., oxygen ions having negative charges) such that remanent polarization Pdn may control or affect a movement of the materials in the resistance switching material layer 130. For example, the remanent polarization Pdn may induce materials 44b having positive charges (e.g., materials having an oxygen vacancy) to accumulate in a lower portion of the resistance switching material layer 130, adjacent to the ferroelectric material layer 120. In such a case, the remanent polarization Pdn may also induce oxygen ions 44a having negative charges, to accumulate or collect at or near an interface between the resistance switching material layer 130 and the interfacial insulation layer 150. As a result, the remanent polarization Pdn may suppress or inhibit oxygen ions 44a previously released from interfacial insulation layer 150 to migrate into inner regions of the resistance switching material layer 130 after the positive voltage (+V of FIG. 4) is removed. While the remanent polarization Pdn induces the materials 44b having the positive charges, materials 40a having negative charges may also be induced to collect in an upper portion of the lower electrode 110 adjacent to the ferroelectric material layer 120.

As described above, if the resistance change memory device 1 has a high resistive state, the remanent polarization Pdn may suppress at least a portion of the interfacial insulation layer 150 from degrading or breaking down through release of the oxygen ions. Accordingly, the remanent polarization Pdn may help stabilize the interfacial insulation layer 150 at an interface between the resistance switching material layer 130 and the upper electrode 140. Consequently, the resistance change memory device 1 can more easily maintain a high resistive state. In conclusion, the remanent polarization Pdn in the ferroelectric material layer 120 may apply an electric attractive force or an electric repulsive force to the resistance switching material layer 130 to control variation of a resistance value of the resistance change memory device 1.

Figure 6:
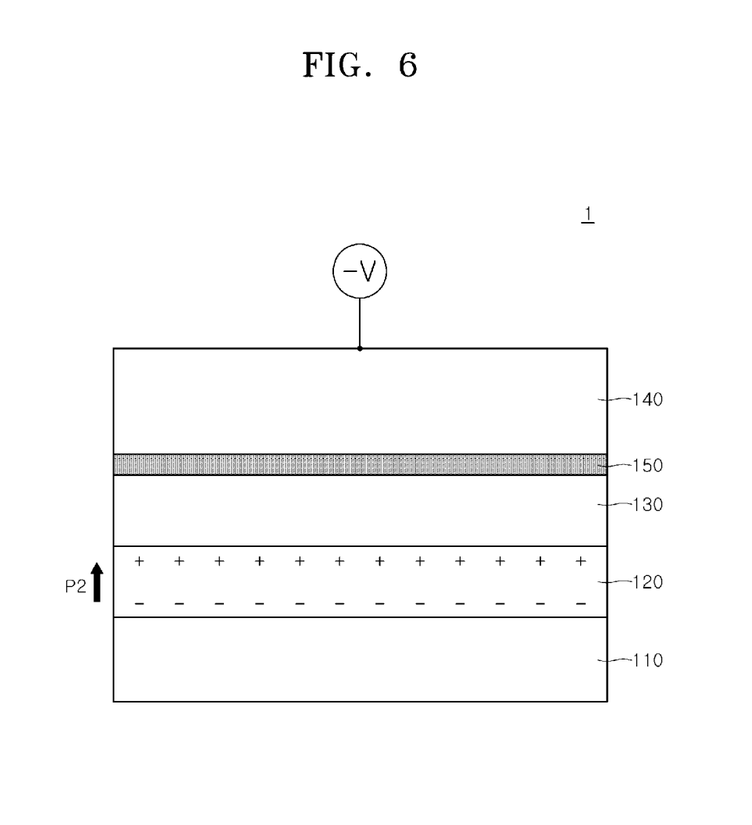

Referring to FIG. 6, a negative voltage −V may be applied to the upper electrode 140 of the resistance change memory device 1 having a high resistive state. In such a case, the lower electrode 110 may be grounded, or a predetermined positive voltage may be applied to the lower electrode 110.

The negative voltage −V may correspond to a voltage for forming at least the second coercive field Ec2 (see FIG. 2) across the ferroelectric material layer 120 and for providing at least the set voltage Vset (see FIG. 3) to the resistance switching material layer 130. In an embodiment, the negative voltage −V may correspond to a voltage for generating at least the second saturation field Es2 (see FIG. 2) across the ferroelectric material layer 120 and for applying at least the set voltage Vset (see FIG. 3) to the resistance switching material layer 130.

If the negative voltage −V is applied to the upper electrode 140 while the lower electrode 110 is grounded, a second polarization P2 may be formed in the ferroelectric material layer 120 with a direction or orientation from the upper electrode 110 toward the resistance switching material layer 130. In addition, oxygen ions in the interfacial insulation layer 150 may move into the resistance switching material layer 130 in response to the negative voltage −V to partially or totally break down or decompose the interfacial insulation layer 150. In such a case, the resistance change memory device 1 may be switched from a high resistive state into a low resistive state due to degradation of the interfacial insulation layer 150.

Referring to FIG. 7, after the applied negative voltage (−V of FIG. 6) is removed, the interfacial insulation layer 150 may be still absent. Alternatively, the interfacial insulation layer 150 only partially remains, without re-forming. Thus, the resistance change memory device 1 may retain a low resistive state. In addition, the remanent polarization Pup having the same direction as the second polarization P2 may remain in the ferroelectric material layer 120 after the negative voltage (−V of FIG. 6) is removed. Thus, positive charges 52b may collect in an upper portion of the ferroelectric material layer 120 adjacent to the resistance switching material layer 130, and negative charges 52a may accumulate in a lower portion of the ferroelectric material layer 120 adjacent to the lower electrode 110.

The remanent polarization Pup may apply an attractive force or a repulsive force to materials having electric charges (e.g., oxygen ions having negative charges) such that the remanent polarization Pup controls or affects a movement of the materials in the resistance switching material layer 130. For example, the remanent polarization Pup may induce oxygen ions 54a having negative charges to collect in a lower portion of the resistance switching material layer 130 adjacent to the ferroelectric material layer 120. In such a case, the remanent polarization Pup may also induce materials 54b having positive charges (e.g. materials having an oxygen vacancy) to accumulate or collect at or near an interface between the resistance switching material layer 130 and the interfacial insulation layer 150. As a result, the remanent polarization Pup may suppress or reduce the amount of oxygen ions released from the interfacial insulation layer 150 to recombine with the upper electrode 140, such that an additional interfacial insulation layer is prevented from forming at the interface between the resistance switching material layer 130 and the upper electrode 150. While the remanent polarization Pup induces the oxygen ions 54a having negative charges, materials 50b having positive charges may be induced to collect in an upper portion of the lower electrode 110 adjacent to the ferroelectric material layer 120.

As described above, after the negative voltage −V applied to the upper electrode 140 is removed, the remanent polarization Pup may suppress oxygen ions in the resistance switching material layer 130 from moving toward the upper electrode 140. Thus, the remanent polarization Pup may suppress additional formation or re-formation of the interfacial insulation layer 150. Accordingly, an interface between the resistance switching material layer 130 and the upper electrode 140 may be stabilized by the remanent polarization Pup. As a result, the resistance change memory device 1 may stably maintain a low resistive state. In conclusion, after the negative voltage −V is removed, the remanent polarization Pup in the ferroelectric material layer 120 may apply an electric attractive force or an electric repulsive force to the resistance switching material layer 130 to control variation of a resistance value of the resistance change memory device 1.

According to the embodiment described above, a resistance change memory device may include a ferroelectric material layer and a resistance switching material layer which are stacked between a lower electrode and an upper electrode. After a voltage (a positive voltage or a negative voltage) applied to the upper electrode is removed, remanent polarization remaining in the ferroelectric material layer may apply an attractive force or a repulsive force to materials having electric charges. Accordingly, a movement of the materials having electric charges in the resistance switching material layer may be controlled. As a result, the remanent polarization in the ferroelectric material layer may stabilize an electrical resistance value of the resistance switching material layer. Thus, a data retention characteristic of the resistance change memory device corresponding to a nonvolatile memory device may be improved and made more reliable.

Figure 8:
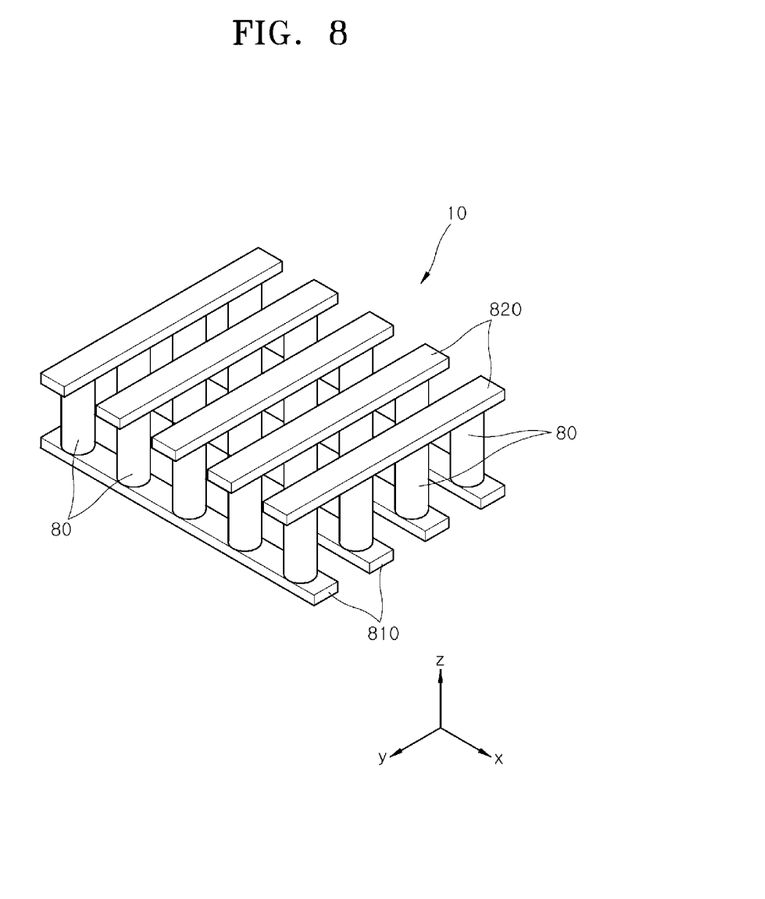
FIG. 8 is a perspective view illustrating a three-dimensional nonvolatile memory device according to an embodiment of the present disclosure.
Figure 9:
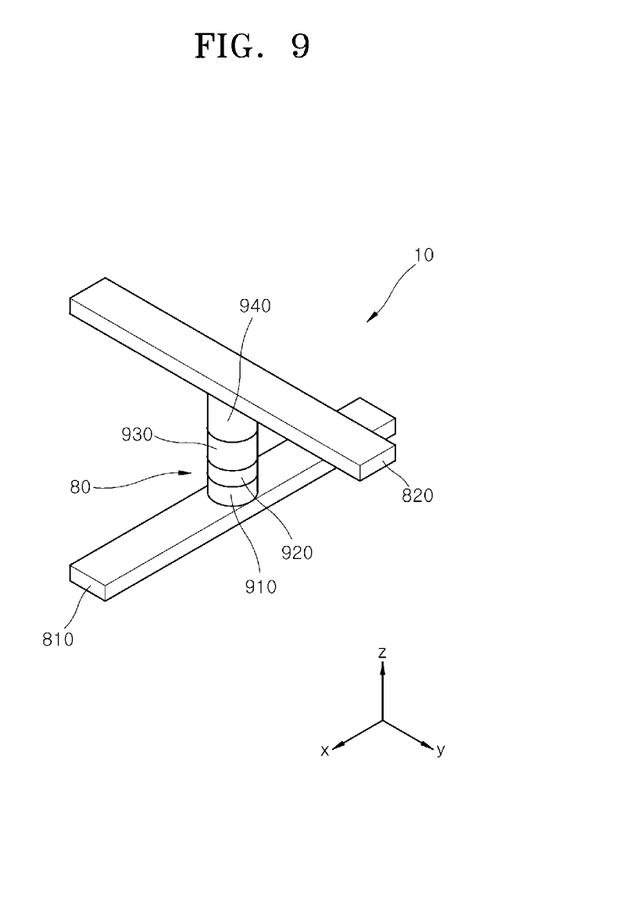
FIG. 9 is an enlarged view illustrating a portion of the three-dimensional nonvolatile memory device shown in FIG. 8.

The resistance change memory device according to embodiments described herein may be applied to three-dimensional nonvolatile memory devices. FIG. 8 is a perspective view illustrating a three-dimensional nonvolatile memory device 10 employing the resistance change memory device 1 according to the embodiment. FIG. 9 is an enlarged view illustrating a portion of the three-dimensional nonvolatile memory device 10 shown in FIG. 8.

Referring to FIG. 8, the nonvolatile memory device 10 may include first conductive lines 810 arrayed to be parallel with an X-axis, second conductive lines 820 arrayed to be parallel with a Y-axis intersecting the X-axis, and pillar structures 80 respectively disposed at cross points of the first conductive lines 810 and the second conductive lines 820. Each of the pillar structures 80 may be disposed between one of the first conductive lines 810 and one of the second conductive lines 820 and may extend along a Z-axis. In each of FIGS. 8 and 9, the X-axis, the Y-axis and the Z-axis may be orthogonal to each other. However, the present disclosure is not limited thereto. For example, the X-axis and the Y-axis may intersect each other at other, non-right angles. The pillar structures 80 may be arrayed in a matrix form along the X-axis and the Y-axis to provide an array of pillar structures. Each of the pillar structures 80 may act as any one of memory cells of the nonvolatile memory device 10.

Referring to FIG. 9, the pillar structure 80 may include a lower electrode 910, a ferroelectric material layer 920, a resistance switching material layer 930 and an upper electrode 940, which are sequentially stacked on a portion of the first conductive line 810. The pillar structure 80 may have substantially the same configuration as the resistance change memory device 1 described above and with reference to FIG. 1. That is, the lower electrode 910, the ferroelectric material layer 920, the resistance switching material layer 930 and the upper electrode 940 may correspond to the lower electrode 110, the ferroelectric material layer 120, the resistance switching material layer 130 and the upper electrode 140, respectively.

As described above, a resistive state of the pillar structure 80 may depend on the formation or decomposition of an interfacial insulation layer located between the resistance switching material layer 930 and the upper electrode 940 while a voltage is applied between the first conductive line 810 and the second conductive line 820.

Even after the voltage applied between the first conductive line 810 and the second conductive line 820 is removed, the interfacial insulation layer may still be present, or the interfacial insulation layer may be partially or totally absent due to decomposition. Thus, the pillar structure 80 may act as a nonvolatile memory cell. In addition, remanent polarization remaining in the ferroelectric material layer 920 after removal of the voltage applied between the first conductive line 810 and the second conductive line 820 may stabilize a resistive state of the pillar structure 80. Thus, a data retention characteristic of the pillar structure 80 may be improved.

Although not shown in the drawings, the resistance change memory device 1 may be utilized in a synapse element included in neuromorphic chips. For example, a technology of realizing sixty-four different conductance states of a memory cell included in a titanium oxide ($TiO_x$) material based resistive random access memory (RRAM) device is disclosed in an article, IEEE Electron Device Letters, VOL. 37, No. 12, pp. 1559-1562, which is incorporated by reference herein in its entirety. The remanent polarization of the ferroelectric material layer included in the resistance change memory device according to an embodiment may allow the resistance change memory device to store a plurality of reliable conductance states (i.e., a plurality of reliable resistive states) after a voltage applied to the resistance change memory device is removed. Thus, the resistance change memory device according to an embodiment may be effectively used in a synapse element for storing multi-level signals in a non-volatile manner.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A resistance change memory device comprising:
a lower electrode;
a ferroelectric material layer disposed on the lower electrode;
a resistance switching material layer disposed on the ferroelectric material layer; and
an upper electrode disposed on the resistance switching material layer,
wherein the resistance change memory device further comprises an interfacial insulation layer located between the upper electrode and the resistance switching material layer, and
wherein formation or decomposition of the interfacial insulation layer is controlled by an external voltage between the lower electrode and the upper electrode.

2. The resistance change memory device of claim 1, wherein the resistance switching material layer is disposed directly on the ferroelectric material layer.

3. The resistance change memory device of claim 1, wherein a remanent polarization in the ferroelectric material layer applies an electrical attractive force or an electrical repulsive force to the resistance switching material layer.

4. The resistance change memory device of claim 1, wherein after an applied voltage is removed from the upper electrode, a remanent polarization in the ferroelectric material layer induces charges to accumulate at an interface between the ferroelectric material layer and the resistance switching material layer.

5. The resistance change memory device of claim 4, wherein the induced charges create an electric field across the resistance switching material layer that controls the movement of charges in the resistance switching material layer.

6. The resistance change memory device of claim 1, wherein the resistance switching material layer includes movable oxygen ions.

7. The resistance change memory device of claim 6,
wherein when a positive voltage is applied to the upper electrode, then the upper electrode is combined with movable oxygen ions to form the interfacial insulation layer located between the resistance switching material layer and the upper electrode; and
wherein when a negative voltage is applied to the upper electrode, then the movable oxygen ions are released from the interfacial insulation layer, which decomposes.

8. The resistance change memory device of claim 7,
wherein when a first remanent polarization having an orientation from the upper electrode toward the lower electrode is formed in the ferroelectric material layer by the positive voltage applied to the upper electrode, then the first remanent polarization reduces the number of movable oxygen ions that are released from the interfacial insulation layer; and
wherein when a second remanent polarization having an orientation from the lower electrode toward the upper electrode is formed in the ferroelectric material layer by the negative voltage applied to the upper electrode, then the second remanent polarization reduces the amount of movable oxygen ions in the resistance switching material layer moving toward the upper electrode.

9. The resistance change memory device of claim 1, wherein the resistance switching material layer includes a perovskite type oxide material.

10. The resistance change memory device of claim 9, wherein the perovskite type oxide material includes at least one of a PCMO($Pr_{1-x}Ca_xMnO_3$, where, $0<x<1$) material, a LCMO($La_{1-x}Ca_xMnO_3$, where, $0<x<1$) material, a BSCFO ($Ba_{0.5}Sr_{0.5}Co_{0.8}Fe_{0.2}O_{3-\delta}$) material, a YBCO($YBa_2Cu_3O_{7-x}$, where, $0<x<1$) material, a $(Ba,Sr)TiO_3$(Cr, Nb-doped) material, a $SrZrO_3$(Cr,V-doped) material, a (La, Sr)$MnO_3$ material, a $Sr_{1-x}La_xTiO_3$(where, $0<x<1$) material, a $La_{1-x}Sr_xFeO_3$ (where, $0<x<1$) material, a $La_{1-x}Sr_xCoO_3$(where, $0<x<1$) material, a $SrFeO_{2.7}$ material, a $LaCoO_3$ material, a $RuSr_2GdCu_2O_3$ material and a $YBa_2Cu_3O_7$ material.

11. The resistance change memory device of claim 1, wherein the resistance switching material layer includes a metal oxide material having a nonstoichiometric composition.

12. The resistance change memory device of claim 11, wherein the metal oxide material includes at least one of a titanium oxide material, an aluminum oxide material, a nickel oxide material, a copper oxide material, a zirconium oxide material, a manganese oxide material, a hafnium oxide material, a tungsten oxide material, a tantalum oxide material, a niobium oxide material and a ferrum oxide material.

13. The resistance change memory device of claim 1, wherein the ferroelectric material layer includes a metal oxide material having a perovskite crystalline structure.

14. The resistance change memory device of claim 1, wherein the ferroelectric material layer includes at least one of a hafnium oxide material, a zirconium oxide material and a hafnium zirconium oxide material.

15. The resistance change memory device of claim 1, wherein the upper electrode includes at least one of an aluminum (Al) material, a molybdenum (Mo) material, a platinum (Pt) material, a titanium (Ti) material, a nickel (Ni) material, a tungsten (W) material, a tantalum (Ta) material, a titanium nitride (TiN) material and a tungsten silicide ($WSi_2$) material.

16. A resistance change memory device comprising:
a lower electrode;
a ferroelectric material layer disposed on the lower electrode having a remanent polarization;
a resistance switching material layer including movable oxygen ions disposed on the ferroelectric material layer; and
an upper electrode disposed on the resistance switching material layer,
wherein a resistance value of the resistance change memory device is determined according to formation or decomposition of an interfacial insulation layer located between the upper electrode and the resistance switching material layer when an external voltage is applied to the upper electrode while the lower electrode is grounded.

17. The resistance change memory device of claim 16, wherein after the external voltage is removed, the remanent polarization induces charges to accumulate at an interface between the ferroelectric material layer and the resistance switching material layer.

18. The resistance change memory device of claim 17, wherein the accumulated charges create an electric field across the resistance switching material layer that control movement of the movable oxygen ions in the resistance switching material layer.

19. The resistance change memory device of claim 16,
wherein when the external voltage has a first polarity, then the upper electrode is combined with movable oxygen ions to form the interfacial insulation layer; and
wherein when the external voltage has a second polarity, then movable oxygen ions are released from the interfacial insulation layer, which decomposes.

20. The resistance change memory device of claim 19,
wherein when the remanent polarization in the ferroelectric material layer has a direction from the upper electrode toward the lower electrode, then the remanent polarization reduces the number of movable oxygen ions released from the interfacial insulation layer; and
wherein when the remanent polarization in the ferroelectric material layer has a direction from the lower electrode toward the upper electrode, then the remanent polarization reduces the amount of movable oxygen ions in the resistance switching material layer that move toward the upper electrode.

* * * * *